United States Patent
Hwang (10) Patent No.: US 10,523,212 B2
(45) Date of Patent: Dec. 31, 2019

(54) SEMICONDUCTOR DEVICE CAPABLE OF PREVENTING RESET OF COUNTING CIRCUIT

(71) Applicant: SK hynix Inc., Icheon-si, Gyeonggi-do (KR)

(72) Inventor: Kyu Dong Hwang, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/103,730

(22) Filed: Aug. 14, 2018

(65) Prior Publication Data

US 2019/0199355 A1 Jun. 27, 2019

(30) Foreign Application Priority Data

Dec. 21, 2017 (KR) .................. 10-2017-0176833

(51) Int. Cl.
*H03K 21/10* (2006.01)
*H03K 21/38* (2006.01)
*H03K 21/02* (2006.01)

(52) U.S. Cl.
CPC .......... *H03K 21/38* (2013.01); *H03K 21/026* (2013.01); *H03K 21/10* (2013.01)

(58) Field of Classification Search
CPC ....... H03K 21/38; H03K 21/026; H03K 21/10

USPC .......................................................... 377/94
See application file for complete search history.

(56) References Cited

U.S. PATENT DOCUMENTS

| | | | | |
|---|---|---|---|---|
| 5,072,166 A * | 12/1991 | Ehsani | ..................... | H02P 6/185 318/685 |
| 7,047,270 B2 * | 5/2006 | Agarwala | ............. | G06F 11/261 708/498 |
| 7,738,621 B2 * | 6/2010 | Yoon | ....................... | G06M 3/12 377/28 |
| 7,924,054 B1 * | 4/2011 | Doubler | .................. | H03M 9/00 326/41 |
| 2006/0227916 A1 * | 10/2006 | Masui | ................... | H03L 7/0995 375/355 |
| 2011/0281593 A1 * | 11/2011 | Chard | ................... | H04J 3/0697 455/461 |
| 2019/0199355 A1 * | 6/2019 | Hwang | .................. | H03K 21/38 |

* cited by examiner

*Primary Examiner* — Ryan Jager
(74) *Attorney, Agent, or Firm* — William Park & Associates Ltd.

(57) ABSTRACT

A semiconductor device may include an input control circuit, a counting circuit, an output control circuit, and a counting operation control circuit. The input control circuit may output a counting input signal based on an input signal and a counting over signal. The counting circuit may generate a preliminary counting code based on the counting input signal. The output control circuit may generate a counting code based on the preliminary counting code. The counting operation control circuit may generate the counting over signal based on a part of the counting code.

16 Claims, 6 Drawing Sheets

SEMICONDUCTOR DEVICE CAPABLE OF PREVENTING RESET OF COUNTING CIRCUIT

CROSS-REFERENCES TO RELATED APPLICATION

The present application claims priority under 35 U.S.C. § 119(a) to Korean application number 10-2017-0176833, filed on Dec. 21, 2017, in the Korean Intellectual Property Office, which is incorporated herein by reference in its entirety.

BACKGROUND

1. Technical Field

Various embodiments may generally relate to a semiconductor integrated circuit, and more particularly, to a semiconductor device.

2. Related Art

A semiconductor device may be configured to receive and output electrical signals.

The semiconductor device may include a counter for counting inputted numbers of the electrical signals or transited numbers of the electrical signals to a set level.

SUMMARY

In an example of an embodiment of the present disclosure, a semiconductor device may be provided. The semiconductor device may include an input control circuit, a counting circuit, an output control circuit, and a counting operation control circuit. The input control circuit may output a counting input signal based on an input signal and a counting over signal. The counting circuit may generate a preliminary counting code based on the counting input signal. The output control circuit may generate a counting code based on the preliminary counting code. The counting operation control circuit may generate the counting over signal based on a part of the counting code.

In an embodiment of the present disclosure, a semiconductor device may be provided. The semiconductor device may include a counting circuit configured to count an input signal to generate a counting code. The semiconductor device may determine a set code value in response to a control signal, and fix the counting code to a maximum value based on the counting code increasing to the set code value.

In an embodiment of the present disclosure, a semiconductor device may be provided. The semiconductor device may include an input control circuit configured to output a counting input signal based on an input signal and a counting over signal. The semiconductor device may include a counting circuit configured to generate a preliminary counting code based on the counting input signal. The semiconductor device may include an output control circuit configured to generate a counting code based on the preliminary counting code. The semiconductor device may include a counting operation control circuit configured to generate the counting over signal based on a part of the counting code. The counting operation control circuit may enable the counting over signal to fix the counting input signal to a specific level to prevent the counting circuit from reaching a code value of the preliminary counting code.

DETAILED DESCRIPTION

Various embodiments will be described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments. However, embodiments of the present disclosure should not be construed as limiting the concepts. Although a few embodiments will be shown and described, it will be appreciated by those of ordinary skill in the art that changes may be made in these embodiments without departing from the principles and spirit of the present disclosure.

Examples of embodiments may provide a semiconductor device that may be capable of counting input signals.

In examples of embodiments of the present disclosure, a semiconductor device may count an input signal to generate a counting code. The semiconductor device may determine a set code value in response to a control signal. The semiconductor device may fix the counting code to a maximum value when the counting code reaches the set code value.

According to examples of embodiments, the semiconductor device may normally count the input signal to the set maximum value so that the semiconductor device may have improved reliability.

Figure 1:
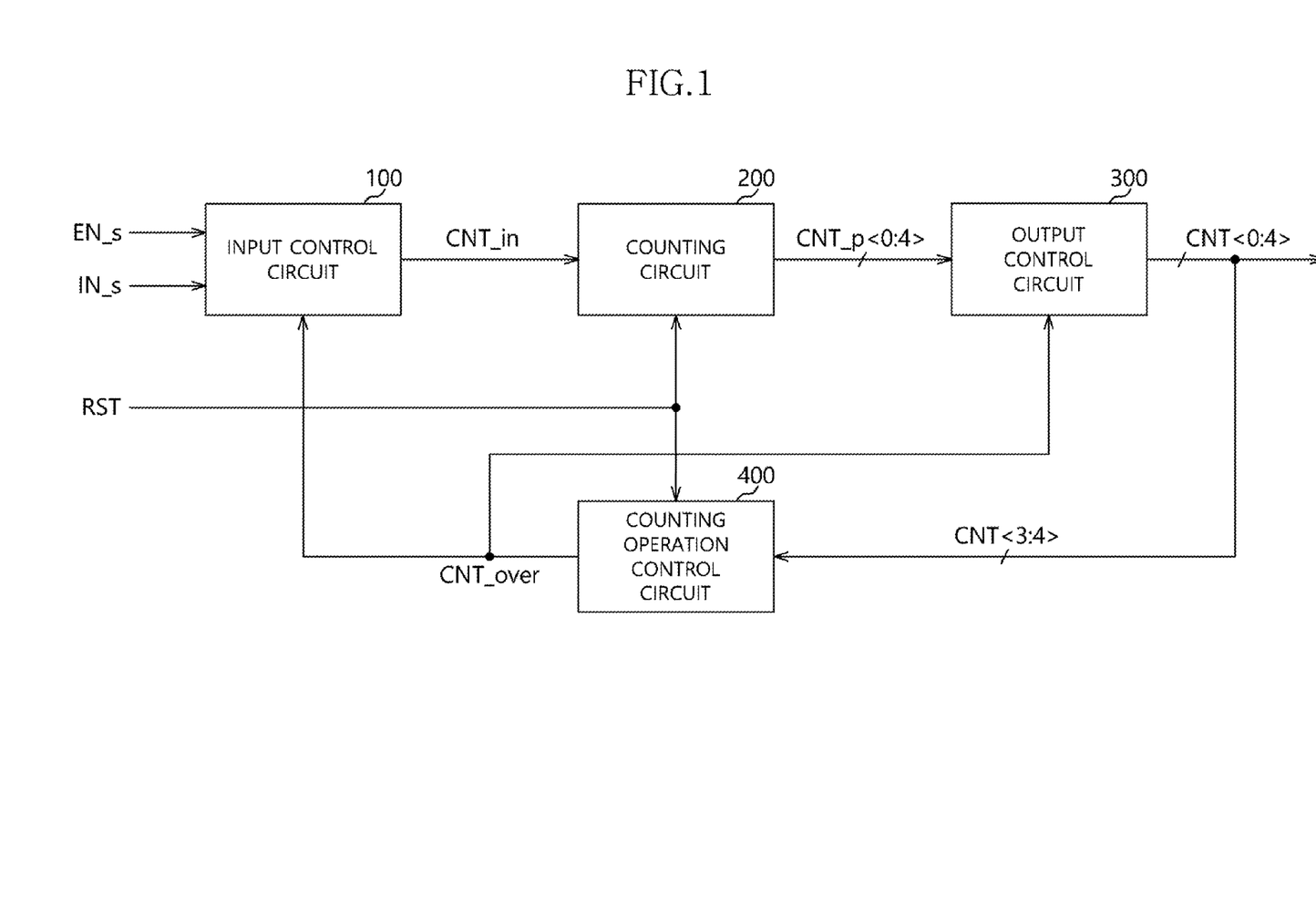
FIG. 1 is a view illustrating a semiconductor device in accordance with an example of an embodiment.

FIG. 1 is a view illustrating a semiconductor device in accordance with examples of embodiments.

Referring to FIG. 1, a semiconductor device according to an embodiment may include an input control circuit 100, a counting circuit 200, an output control circuit 300 and a counting operation control circuit 400.

The input control circuit 100 may output an input signal IN_s as a counting input signal CNT_in in response to an enabling signal EN_s and a counting over signal CNT_over. For example, when the enabling signal EN_s is disabled or the counting over signal CNT_over is enabled, the input control circuit 100 may fix the counting input signal CNT_in to a specific level and output the fixed counting input signal CNT_in regardless of the input signal IN_s. When the enabling signal EN_s is enabled and the counting over signal CNT_over is disabled, the input control circuit 100 may output the input signal IN_s as the counting over signal CNT_over. The enabling signal IN_s may correspond to a signal for activating the semiconductor device. The enabling signal EN_s may be enabled to a high level and disabled to a low level. The counting over signal CNT_over may be enabled to a high level and disabled to a low level.

The counting circuit 200 may increase a code value of a preliminary counting code CNT_p<0:4> whenever the counting input signal CNT_in may be transited to a specific level. When a rest signal RST is enabled, the counting circuit 200 may initialize the preliminary counting code CNT_p<0:4>. When the counting circuit 200 is initialized by the reset signal RST, the preliminary counting code CNT_p<0:4> may have an initial value. That is, all of bits of the preliminary counting code CNT_p<0:4> may be a low level (0,0, 0,0,0). In an embodiment, the counting circuit 200 may be implemented with software, hardware, or any combination thereof.

The output control circuit 300 may output the preliminary counting code CNT_p<0:4> as a counting code CNT<0:4> in response to the counting over signal CNT_over. For example, when the counting over signal CNT_over is disabled, the output control circuit 300 may output the preliminary counting code CNT_p<0:4> as the counting code CNT<0:4>. When the counting over signal CNT_over is enabled, the output control circuit 300 may output the counting code CNT<0:4> having a code maximum value regardless of the preliminary counting code CNT_p<0:4>. The counting code CNT<0:4> may have the code maximum value when all of bits of the counting code CNT<0:4> have a high level (1, 1, 1, 1, 1)

The counting operation control circuit 400 may generate the counting over signal CNT_over in response to the counting code CNT<0:4> and the reset signal RST. For example, when a part CNT<3:4> of the counting code CNT<0:4> reaches a maximum value during the reset signal RST being disabled, the counting operation control circuit 400 may enable the counting over signal CNT_over to a high level. Particularly, when all of bits in the part CNT<3:4> of the counting code CNT<0:4> are a high level during the reset signal RST that is disabled, the counting operation control circuit 400 may enable the counting over signal CNT_over. When the rest signal RST is enabled, the counting operation control circuit 400 may disable the counting over signal CNT_over regardless of the part CNT<3:4> of the counting code CNT<0:4>.

Figure 2:
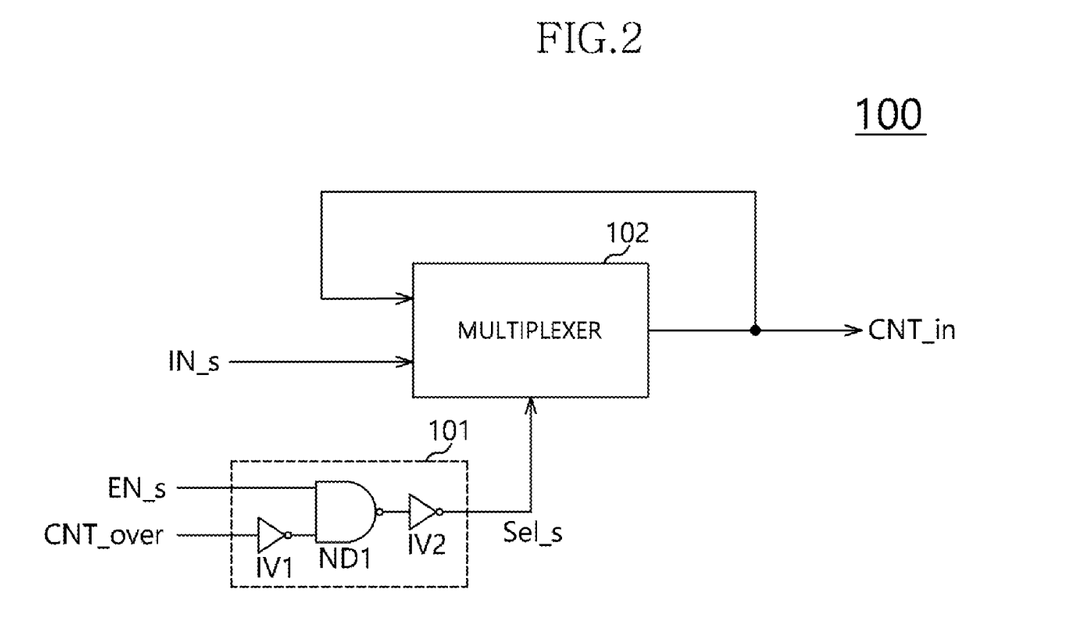
FIG. 2 is a view illustrating an input control circuit of FIG. 1.

FIG. 2 is a view illustrating an input control circuit of FIG. 1.

Referring to FIG. 2, the input control circuit 100 may include a selection signal generation circuit 101 and a multiplexer 102.

The selection signal generation circuit 101 may generate a selection signal Sel_s in response to the enabling signal EN_s and the counting over signal CNT_over. For example, when the enabling signal EN_s is enabled to a high level and the counting over signal CNT_over is disabled to a low level, the selection signal generation circuit 101 may generate the selection signal Sel_s having a high level. When the enabling signal EN_s is disabled to a low level or the counting over signal CNT_over is enabled to a high level, the selection signal generation circuit 101 may generate the selection signal Sel_s having a low level.

The selection signal generation circuit 101 may include, for example but not limited to, a first NAND gate ND1, first inverter IV1 and a second inverter IV2. The first inverter IV1 may receive the counting over signal CNT_over. The first NAND gate ND1 may receive the enabling signal EN_s and an output signal of the first inverter IV1. The second inverter IV2 may receive an output signal of the first NAND gate ND1. The second inverter IV2 may output the selection signal Sel_s.

The multiplexer 102 may output the input signal IN_s as the counting input signal CNT_in in response to the selection signal Sel_s or receive the counting input signal CNT_in and output the received counting input signal CNT_in. When the multiplexer 102 receives and outputs the counting input signal CNT_in, a level of the counting input signal CNT_in may be fixed. For example, when the selection signal Sel_s is enabled to a high level, the multiplexer 102 may output the input signal IN_s as the counting input signal CNT_in. When the selection signal Sel_s is disabled to a low level, the multiplexer 102 may receive and output the counting input signal CNT_in so that the level of the counting input signal CNT_in may be fixed.

The multiplexer 102 may include a first input terminal, a second input terminal, an output terminal and a selection control terminal. The first input terminal may receive the input signal IN_s. The second input terminal may receive the counting input signal CNT_in. The output terminal may output the counting input signal CNT_in. The selection control terminal may receive the selection signal Sel_s.

Figure 3:
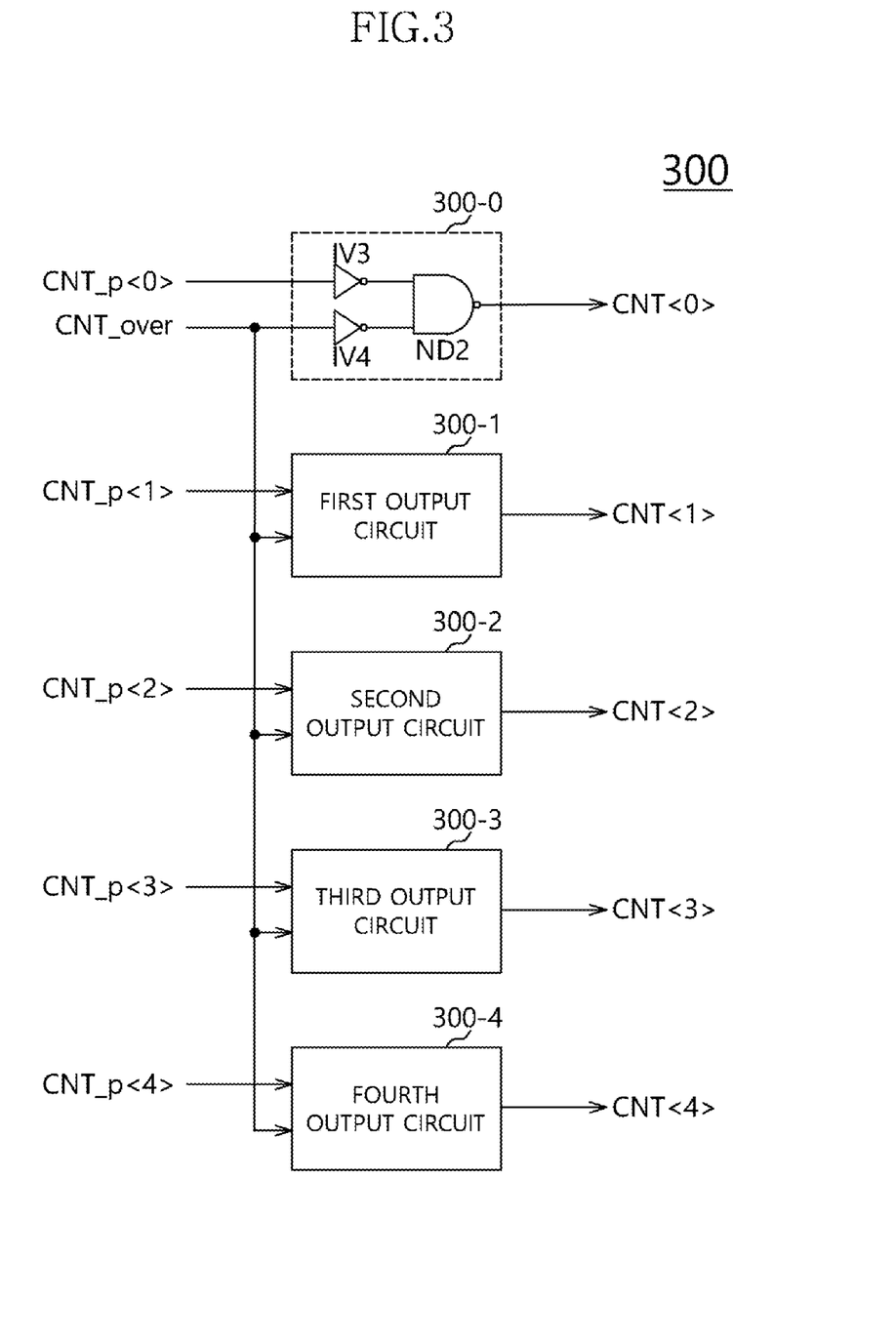
FIG. 3 is a view illustrating an output control circuit of FIG. 1.

FIG. 3 is a view illustrating an output control circuit of FIG. 1.

Referring to FIG. 3, the output control circuit 300 may include zeroth to fourth output circuits 300-0~300-4.

Each of the zeroth and fourth output circuits 300-0~300-4 may each output bits of the preliminary counting code CNT_p<0:4> as each bit of the counting code CNT<0:4> or fix each of the bits of the counting code CNT<0:4> to a high level and output the fixed bit for each of the bits in response to the counting over signal CNT_over. For example, when the counting over signal CNT_over is disabled to a low level, each of the zeroth and fourth output circuits 300-0~300-4 may output each bit of the preliminary counting code CNT_p<0:4> as each of bit of the counting code CNT<0:4>. When the counting over signal CNT_over is enabled to a high level, each of the zeroth and fourth output circuits 300-0~300-4 may fix each of the bits of the counting code CNT<0:4> to a high level and output the each of the fixed bits.

Each of the zeroth and fourth output circuits 300-0~300-4 may have substantially the same configuration except for different input signals and different output signals. Therefore, any further illustrations with respect to the first to fourth output circuit 300-1~300-4 may be omitted herein for brevity.

The zeroth output circuit 300-0 may include a third inverter IV3, a fourth inverter IV4 and a second NAND gate ND2. The third inverter IV3 may receive a first bit CNT_p<0> among the preliminary counting code CNT_p<0:4>. The fourth inverter IV4 may receive the counting over signal CNT_over. The second NAND gate ND2 may receive output signals of the third and fourth inverter IV3 and IV4 to output a first bit CNT<0>.

Figure 4:
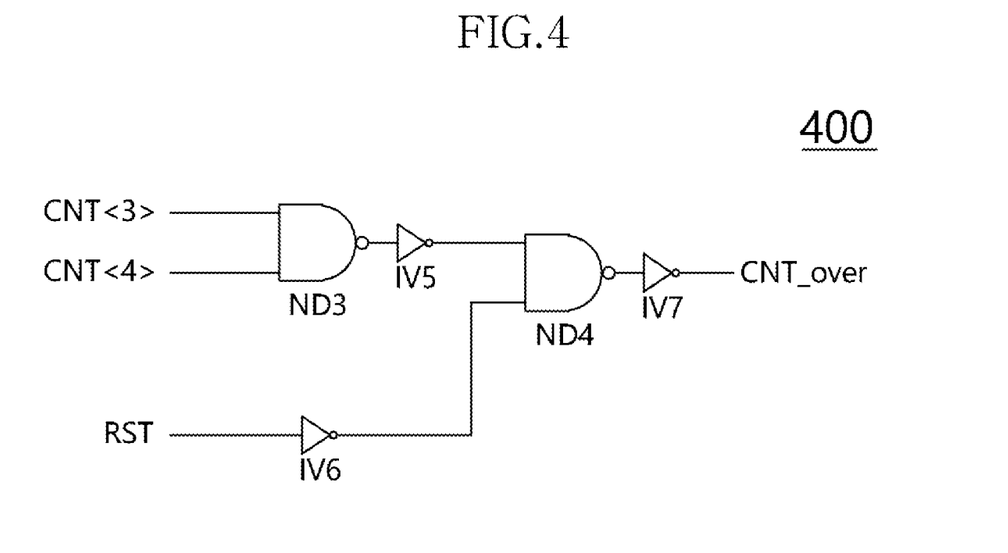
FIG. 4 is a view illustrating a counting operation control circuit of FIG. 1.

When the part CNT<3:4> among the counting code CNT<0:4> has a maximum value, i.e., a high level during the reset signal RST is disabled to a low level, the counting operation control circuit 400 in FIG. 4 may enable the counting over signal CNT_over. When the reset signal RST is enabled to a high level, the counting operation control circuit 400 may disable the counting over signal CNT_over to a low level. As illustrated in FIG. 4, the counting operation control circuit 400 may include, for example but not limited to, a third NAND gate ND3, a fourth NAND gate ND4, a fifth inverter IV5, a sixth inverter IV56 and a seventh inverter IV7.

The third NAND gate ND3 may receive the part CNT<3:4> of the counting code CNT<0:4>. The fifth inverter IV5 may receive an output signal of the third NAND gate ND3. The sixth inverter IV6 may receive the reset signal RST. The fourth NAND gate ND4 may receive output signals of the fifth and sixth inverters IV5 and IV6. The seventh inverter IV7 may receive an output signal of the fourth NAND gate ND4 to output the counting over signal CNT_over.

Hereinafter, operations of the semiconductor device in accordance with examples of embodiments will be discussed.

When the enabling signal EN_s is enabled, the input control circuit 100 may output the input signal IN_s as the counting input signal CNT_in.

The counting circuit 200 may increase the code value of the preliminary counting code CNT_p<0:4> whenever the counting input signal CNT_in is transited to a specific level, i.e., a high level.

When the counting over signal CNT_over is disabled, the output control circuit 300 may output the preliminary counting code CNT_p<0:4> as the counting code CNT<0:4>.

When the part CNT<3:4> of the counting code CNT<0:4> reaches the maximum value (1,1), the counting operation control circuit 400 may enable the counting over signal CNT_over.

When the counting over signal CNT_over is enabled, the output control circuit 300 may fix the counting code CNT<0:4> to the maximum value (1, 1, 1, 1, 1) regardless of the preliminary counting code CNT_p<0:4>.

When the counting over signal CNT_over is enabled, the input control circuit 100 may fix the counting input signal CNT_in to a specific level regardless of the input signal IN_s.

When the reset signal RST is enabled, the counting circuit 200 may output the preliminary counting signal CNT_p<0:4> having an initial value (0, 0, 0, 0, 0). When the reset signal RST is enabled, the counting operation control circuit 400 may disabled the enabled counting over signal CNT_over. When the counting over signal CNT_over is disabled, the output control circuit 300 may output the preliminary counting signal CNT_p<0:4> as the counting code CNT<0:4>. Thus, when the reset signal RST is enabled, the maximum value of the counting code CNT<0:4> may be changed into the initial value (0, 0, 0, 0, 0). Further, when the enabled counting over signal CNT_over is disabled, the input control circuit 100 may output the input signal IN_s as the counting input signal CNT_in.

When the reset signal RST is disabled, the counting circuit 200 may perform the counting operation in which the code value of the counting code CNT<0:4> is increased in response to the counting input signal CNT_in.

The above-mentioned operations of the semiconductor device may be represented by a following table.

| Counting code CNT<0:4> | | | | | |
|---|---|---|---|---|---|
| CNT<4> | CNT<3> | CNT<2> | CNT<1> | CNT<0> | state |
| 0 | 0 | 0 | 0 | 0 | RST |
| 0 | 0 | 0 | 0 | 1 | |
| 0 | 0 | 0 | 1 | 0 | |
| 0 | 0 | 0 | 1 | 1 | |
| . | . | . | . | . | . |
| . | . | . | . | . | . |
| . | . | . | . | . | . |

-continued

| Counting code CNT<0:4> | | | | | |
|---|---|---|---|---|---|
| CNT<4> | CNT<3> | CNT<2> | CNT<1> | CNT<0> | state |
| . | . | . | . | . | . |
| 1 | 0 | 1 | 1 | 1 | |
| 1 | 1 | 0 | 0 | 0 | CNT_over |
| 1 | 1 | 1 | 1 | 1 | Maximum value |
| 1 | 1 | 1 | 1 | 1 | Maximum value |

As illustrated in the above table, when the partial bit CNT<3:4> reaches a set value, i.e., the maximum value during the code value of the counting code CNT<0:4> is gradually increased, the counting operation may be stopped and the counting code CNT<0:4> may be fixed to the maximum value (1, 1, 1, 1, 1). When the reset signal RST is enabled, the code value of the counting code CNT<0:4> may be changed into the initial value (0, 0, 0, 0, 0). The counting operation may then be performed.

According to an example of an embodiment, when the increased code CNT<0:4> having the increased code value reaches a code value (1, 1, 0, 0, 0), the counting operation may be stopped and the counting code CNT<0:4> may be fixed to the maximum value (1, 1, 1, 1, 1).

Figure 5:
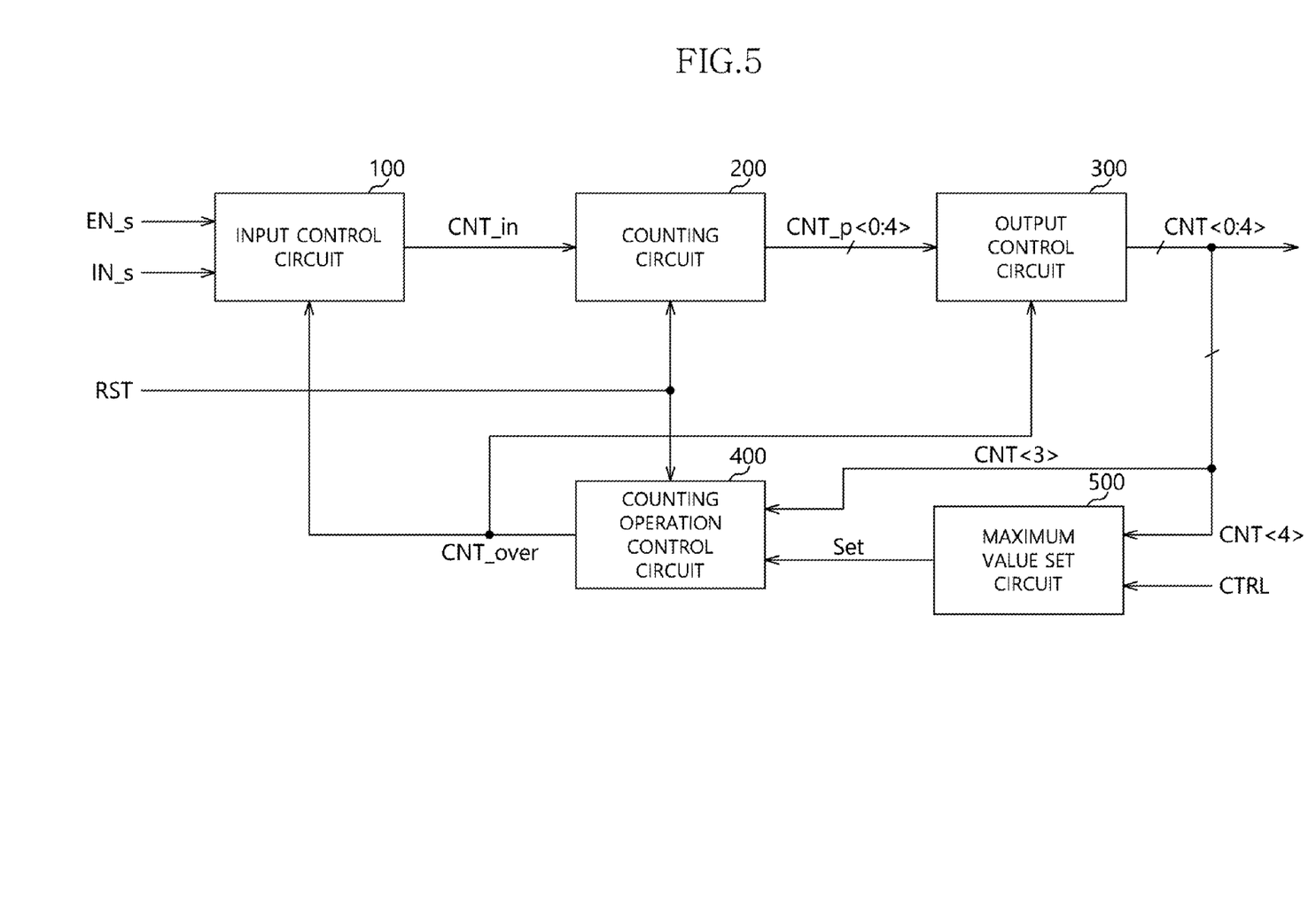
FIG. 5 is a view illustrating a semiconductor device in accordance with an example of an embodiment.

FIG. 5 is a view illustrating a semiconductor device in accordance with an example of an embodiment.

Referring to FIG. 5, a semiconductor device according to an embodiment may include an input control circuit 100, a counting circuit 200, an output control circuit 300, a counting operation control circuit 400 and a maximum value set circuit 500.

The input control circuit 100 may output an input signal IN_s as a counting input signal CNT_in in response to an enabling signal EN_s and a counting over signal CNT_over. For example, when the enabling signal EN_s is disabled or the counting over signal CNT_over is enabled, the input control circuit 100 may fix the counting input signal CNT_in to a specific level and output the fixed counting input signal CNT_in regardless of the input signal IN_s. When the enabling signal EN_s is enabled and the counting over signal CNT_over is disabled, the input control circuit 100 may output the input signal IN_s as the counting over signal CNT_over. The enabling signal IN_s may correspond to a signal for activating the semiconductor device. The enabling signal IN_s may be enabled to a high level and disabled to a low level. The counting over signal CNT_over may be enabled to a high level and disabled to a low level.

The counting circuit 200 may increase a code value of a preliminary counting code CNT_p<0:4> whenever the counting input signal CNT_in transitions to a specific level. When a rest signal RST is enabled, the counting circuit 200 may initialize the preliminary counting code CNT_p<0:4>. When the counting circuit 200 is initialized by the reset signal RST, the preliminary counting code CNT_p<0:4> may have an initial value. That is, all of bits of the preliminary counting code CNT_p<0:4> may be a low level (0,0, 0,0,0).

The output control circuit 300 may output the preliminary counting code CNT_p<0:4> as a counting code CNT<0:4> in response to the counting over signal CNT_over. For example, when the counting over signal CNT_over is disabled, the output control circuit 300 may output the preliminary counting code CNT_p<0:4> as the counting code CNT<0:4>. When the counting over signal CNT_over is enabled, the output control circuit 300 may output the counting code CNT<0:4> having a code maximum value regardless of the preliminary counting code CNT_p<0:4>. The counting code CNT<0:4> may have the code maximum value when all of bits of the counting code CNT<0:4> have a high level (1, 1, 1, 1, 1).

The counting operation control circuit 400 may generate the counting over signal CNT_over in response to the counting code CNT<0:4> and the reset signal RST. For example, when a part CNT<3:4> of the counting code CNT<0:4> and the set signal Set reach a maximum value during the reset signal RST that is disabled, the counting operation control circuit 400 may enable the counting over signal CNT_over to a high level. When the rest signal RST is enabled, the counting operation control circuit 400 may disable the counting over signal CNT_over regardless of the part CNT<3:4> of the counting code CNT<0:4> and the set signal Set.

The maximum value set circuit 500 may generate the set signal Set in response to a part CNT<4> of the counting code CNT<0:4> and a control signal CTRL. For example, when the control signal CTRL is enabled to a high level, the maximum value set circuit 500 may enable the set signal Set to a high level regardless of the part CNT<4> of the counting code CNT<0:4>. When the control signal CTRL is disabled to a low level, the maximum value set circuit 500 may output the part CNT<4> of the counting code CNT<0:4> as the set signal Set.

As illustrated in FIG. 2, the input control circuit 100 may include a selection signal generation circuit 101 and a multiplexer 102.

The selection signal generation circuit 101 may generate a selection signal Sel_s in response to the enabling signal EN_s and the counting over signal CNT_over. For example, when the enabling signal EN_s is enabled to a high level and the counting over signal CNT_over is disabled to a low level, the selection signal generation circuit 101 may generate the selection signal Sel_s having a high level. When the enabling signal EN_s is disabled to a low level or the counting over signal CNT_over is enabled to a high level, the selection signal generation circuit 101 may generate the selection signal Sel_s having a low level.

The selection signal generation circuit 101 may include, for example but not limited to, a first NAND gate ND1, first inverter IV1 and a second inverter IV2. The first inverter IV1 may receive the counting over signal CNT_over. The first NAND gate ND1 may receive the enabling signal EN_s and an output signal of the first inverter IV1. The second inverter IV2 may receive an output signal of the first NAND gate ND1. The second inverter IV2 may output the selection signal Sel_s.

The multiplexer 102 may output the input signal IN_s as the counting input signal CNT_in in response to the selection signal Sel_s or receive the counting input signal CNT_in and output the received counting input signal CNT_in. When the multiplexer 102 receives and outputs the counting input signal CNT_in, a level of the counting input signal CNT_in may be fixed. For example, when the selection signal Sel_s is enabled to a high level, the multiplexer 102 may output the input signal IN_s as the counting input signal CNT_in. When the selection signal Sel_s is disabled to a low level, the multiplexer 102 may receive and output the counting input signal CNT_in so that the level of the counting input signal CNT_in may be fixed.

The multiplexer 102 may include a first input terminal, a second input terminal, an output terminal and a selection control terminal. The first input terminal may receive the input signal IN_s. The second input terminal may receive the counting input signal CNT_in. The output terminal may output the counting input signal CNT_in. The selection control terminal may receive the selection signal Sel_s.

As illustrated in FIG. 3, the output control circuit 300 may include zeroth to fourth output circuits 300-0~300-4.

Each of the zeroth and fourth output circuits 300-0~300-4 may output each of bits of the preliminary counting code CNT_p<0:4> as each of bits of the counting code CNT<0:4> or fix each of the bits of the counting code CNT<0:4> to a high level and output the fixed each of the bits in response to the counting over signal CNT_over. For example, when the counting over signal CNT_over is disabled to a low level, each of the zeroth and fourth output circuits 300-0~300-4 may output each of the bits of the preliminary counting code CNT_p<0:4> as each of bits of the counting code CNT<0:4>. When the counting over signal CNT_over is enabled to a high level, each of the zeroth and fourth output circuits 300-0~300-4 may fix each of the bits of the counting code CNT<0:4> to a high level and output the fixed each of the bits.

Each of the zeroth and fourth output circuits 300-0~300-4 may have substantially the same configuration except for different input signals and different output signals. Therefore, any further illustrations with respect to the first to fourth output circuit 300-1~300-4 may be omitted herein for brevity.

The zeroth output circuit 300-0 may include a third inverter IV3, a fourth inverter IV4 and a second NAND gate ND2. The third inverter IV3 may receive a first bit CNT_p<0> among the preliminary counting code CNT_p<0:4>. The fourth inverter IV4 may receive the counting over signal CNT_over. The second NADN gate ND2 may receive output signals of the third and fourth inverter IV3 and IV4 to output a first bit CNT<0>.

When the part CNT<3:4> among the counting code CNT<0:4> have a maximum value, i.e., a high level during the reset signal RST may be disabled to a low level, the counting operation control circuit 400 of FIG. 4 may enable the counting over signal CNT_over to a high level. When the reset signal RST is enabled to a high level, the counting operation control circuit 400 may disable the counting over signal CNT_over to a low level. As illustrated in FIG. 4, the counting operation control circuit 400 may include, for example but not limited to, a third NAND gate ND3, a fourth NAND gate ND4, a fifth inverter IV5, a sixth inverter IV56 and a seventh inverter IV7.

The third NAND gate ND3 may receive the part CNT<3:4> of the counting code CNT<0:4>. The fifth inverter IV5 may receive an output signal of the third NAND gate ND3. The sixth inverter IV6 may receive the reset signal RST. The fourth NAND gate ND4 may receive output signals of the fifth and sixth inverters IV5 and IV6. The seventh inverter IV7 may receive an output signal of the fourth NAND gate ND4 to output the counting over signal CNT_over.

Figure 6:
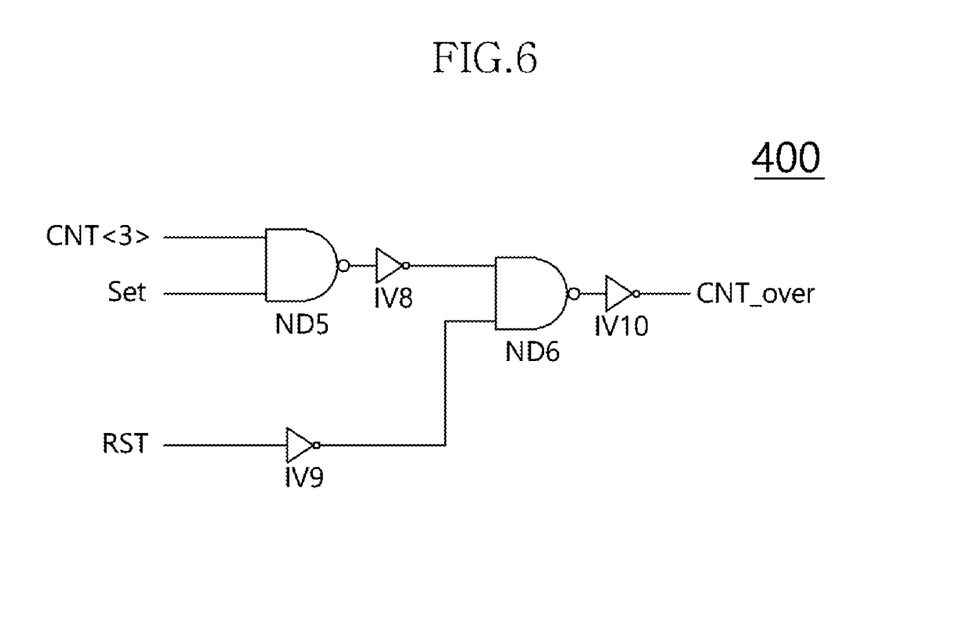
FIG. 6 is a view illustrating a counting operation control circuit of FIG. 5.

The counting operation control circuit 400 may have a configuration as illustrated in FIG. 6. The counting operation circuit 400 may include, for example but not limited to, a fifth NAND gate ND5, a sixth NAND gate ND6, an eighth inverter IV8, a ninth inverter IV9, and tenth inverter IV10.

The fifth NAND gate ND5 may receive the part CNT<3> of the counting code CNT<0:4> and the set signal Set. The eighth inverter IV8 may receive an output signal of the fifth NAND gate ND5. The ninth inverter IV9 may receive the reset signal RST. The sixth NAND gate ND6 may receive output signals of the eighth and ninth inverters IV8 and IV9.

The tenth inverter IV10 may receive an output signal of the sixth NAND gate ND6 to output the counting over signal CNT_over.

Figure 7:
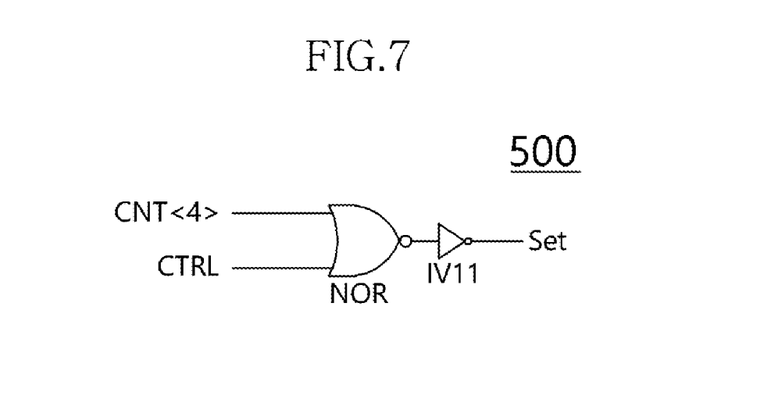
FIG. 7 is a view illustrating a maximum value set circuit of FIG. 5.

FIG. 7 is a view illustrating a maximum value set circuit of FIG. 5.

Referring to FIG. 7, a maximum value set circuit 500 may include, for example but not limited to, a NOR gate NOR and an eleventh inverter IV11. The NOR gate NOR may receive part CNT<4> of the counting code CNT<0:4> and the control signal CTRL. The eleventh inverter IV11 may receive an output signal of the NOR gate NOR to output the set signal Set.

Hereinafter, operations of the semiconductor device in accordance with an example of an embodiment will be discussed.

When the control signal CTRL is a high level, the maximum value set circuit 500 may output the set signal Set having a high level regardless of the part CNT<4> of the counting code CNT<0:4>.

When the enabling signal EN_s is enabled, the input control circuit 100 may output the input signal IN_s as the counting input signal CNT_in.

The counting circuit 200 may increase the code value of the preliminary counting code CNT_p<0:4> whenever the counting input signal CNT_in transitions to a specific level, i.e., a high level.

When the counting over signal CNT_over is disabled, the output control circuit 300 may output the preliminary counting code CNT_p<0:4> as the counting code CNT<0:4>.

When the part CNT<3:4> of the counting code CNT<0:4> reaches the maximum value (1, 1), the counting operation control circuit 400 may enable the counting over signal CNT_over. The set signal Set may be fixed to the high level.

When the counting over signal CNT_over is enabled, the output control circuit 300 may fix the counting code CNT<0:4> to the maximum value (1, 1, 1, 1, 1) regardless of the preliminary counting code CNT_p<0:4>.

When the counting over signal CNT_over is enabled, the input control circuit 100 may fix the counting input signal CNT_in to a specific level regardless of the input signal IN_s.

When the reset signal RST is enabled, the counting circuit 200 may output the preliminary counting signal CNT_p<0:4> having an initial value (0, 0, 0, 0, 0). When the reset signal RST is enabled, the counting operation control circuit 400 may disable the enabled counting over signal CNT_over. When the counting over signal CNT_over is disabled, the output control circuit 300 may output the preliminary counting signal CNT_p<0:4> as the counting code CNT<0:4>. Thus, when the reset signal RST is enabled, the maximum value of the counting code CNT<0:4> may be changed into the initial value (0, 0, 0, 0, 0). Further, when the enabled counting over signal CNT_over is disabled, the input control circuit 100 may output the input signal IN_s as the counting input signal CNT_in.

When the reset signal RST is disabled, the counting circuit 200 may perform the counting operation in which the code value of the counting code CNT<0:4> is increased in response to the counting input signal CNT_in.

The above-mentioned operations of the semiconductor device may be represented by a following table.

| Set signal Set | Counting code CNT<0:4> | | | | | state |
|---|---|---|---|---|---|---|
| | CNT<4> | CNT<3> | CNT<2> | CNT<1> | CNT<0> | |
| 1 | 0 | 0 | 0 | 0 | 0 | RST |
| 1 | 0 | 0 | 0 | 0 | 1 | |
| 1 | 0 | 0 | 0 | 1 | 0 | |
| 1 | 0 | 0 | 0 | 1 | 1 | |
| . | . | . | . | . | . | . |
| . | . | . | . | . | . | . |
| 1 | 0 | 0 | 1 | 1 | 1 | |
| 1 | 0 | 1 | 0 | 0 | 0 | CNT_over |
| 1 | 1 | 1 | 1 | 1 | 1 | Maximum value |
| 1 | 1 | 1 | 1 | 1 | 1 | Maximum value |

As illustrated in the above table, when the part CNT<3> of the counting code CNT<0:4> and the set signal Set reaches a set value, i.e., the maximum value (1, 1) during the code value of the counting code CNT<0:4> is gradually increased, the counting operation may be stopped and the counting code CNT<0:4> may be fixed to the maximum value (1, 1, 1, 1, 1). When the reset signal RST is enabled, the code value of the counting code CNT<0:4> may be changed into the initial value (0, 0, 0, 0, 0). The counting operation may then be performed.

According to an example of an embodiment, when the control signal CTRL is enabled and the increased code CNT<0:4> having the increased code value reaches a code value (0, 1, 0, 0, 0), the counting operation may be stopped and the counting code CNT<0:4> may be fixed to the maximum value (1, 1, 1, 1, 1).

In contrast, when the control signal CTRL is a low level, the maximum value set circuit 500 may output the part CNT<4> of the counting code CNT<0:4> as the set signal Set.

When the enabling signal EN_s is enabled, the input control circuit 100 may output the input signal IN_s as the counting input signal CNT_in.

The counting circuit 200 may increase the code value of the preliminary counting code CNT_p<0:4> whenever the counting input signal CNT_in transitions to a specific level, i.e., a high level.

When the counting over signal CNT_over is disabled, the output control circuit 300 may output the preliminary counting code CNT_p<0:4> as the counting code CNT<0:4>.

When the part CNT<3> of the counting code CNT<0:4> and the set signal Set reaches the maximum value (1, 1), the counting operation control circuit 400 may enable the counting over signal CNT_over. The set signal Set may correspond to the part CNT<4> of the counting code CNT<0:4>.

When the counting over signal CNT_over is enabled, the output control circuit 300 may fix the counting code CNT<0:4> to the maximum value (1, 1, 1, 1, 1) regardless of the preliminary counting code CNT_p<0:4>.

When the counting over signal CNT_over is enabled, the input control circuit 100 may fix the counting input signal CNT_in to a specific level regardless of the input signal IN_s.

When the reset signal RST is enabled, the counting circuit 200 may output the preliminary counting signal CNT_p<0:4> having an initial value (0, 0, 0, 0, 0). When the reset signal RST is enabled, the counting operation control circuit 400 may disable the enabled counting over signal CNT_over. When the counting over signal CNT_over is disabled, the output control circuit 300 may output the preliminary counting signal CNT_p<0:4> as the counting code CNT<0:4>. Thus, when the reset signal RST is enabled, the maximum value of the counting code CNT<0:4> may be changed into the initial value (0, 0, 0, 0, 0). Further, when the enabled counting over signal CNT_over is disabled, the input control circuit 100 may output the input signal IN_s as the counting input signal CNT_in.

When the reset signal RST is disabled, the counting circuit 200 may perform the counting operation in which the code value of the counting code CNT<0:4> is increased in response to the counting input signal CNT_in.

The above-mentioned operations of the semiconductor device may be represented by a following table.

| Set signal Set | Counting code CNT<0:4> | | | | | state |
|---|---|---|---|---|---|---|
| | CNT<4> | CNT<3> | CNT<2> | CNT<1> | CNT<0> | |
| 0 | 0 | 0 | 0 | 0 | 0 | RST |
| 0 | 0 | 0 | 0 | 0 | 1 | |
| 0 | 0 | 0 | 0 | 1 | 0 | |
| 0 | 0 | 0 | 0 | 1 | 1 | |
| . | . | . | . | . | . | . |
| . | . | . | . | . | . | . |
| . | . | . | . | . | . | . |
| 1 | 1 | 0 | 1 | 1 | 1 | |
| 1 | 1 | 1 | 0 | 0 | 0 | CNT_over |
| 1 | 1 | 1 | 1 | 1 | 1 | Maximum value |
| 1 | 1 | 1 | 1 | 1 | 1 | Maximum value |

As shown in the above table, when the part CNT<3> of the counting code CNT<0:4> and the set signal Set reaches a set value, i.e., the maximum value (1, 1) during the code value of the counting code CNT<0:4> is gradually increased, the counting operation may be stopped and the counting code CNT<0:4> may be fixed to the maximum value (1, 1, 1, 1, 1). When the reset signal RST is enabled, the code value of the counting code CNT<0:4> may be changed into the initial value (0, 0, 0, 0, 0). The counting operation may then be performed.

According to an example of an embodiment, when the control signal CTRL is enabled to a low level and the increased code CNT<0:4> having the increased code value reaches a code value (1, 1, 0, 0, 0), the counting operation may be stopped and the counting code CNT<0:4> may be fixed to the maximum value (1, 1, 1, 1, 1).

According to an example of an embodiment, when the control signal CTRL is enabled to a high level and the increased code CNT<0:4> having the increased code value reaches a code value (0, 1, 0, 0, 0), the counting operation may be stopped and the counting code CNT<0:4> may be fixed to the maximum value (1, 1, 1, 1, 1). In contrast, when the control signal CTRL is disabled to a low level and the increased code CNT<0:4> having the increased code value reaches a code value (1, 1, 0, 0, 0), the counting operation may be stopped and the counting code CNT<0:4> may be fixed to the maximum value (1, 1, 1, 1, 1). Therefore, the semiconductor device may determine an enabling timing of the counting over signal CNT_over at a specific value of the counting code CNT<0:4> in accordance with the control signal CTRL. Because the code value of the counting code CNT<0:4> may be fixed to the maximum value when the counting over signal CNT_over is enabled, the semiconductor device may set the maximum value of the counted code as the control signal.

The above described embodiments are intended to illustrate and not to limit the present disclosure. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor device comprising:
   an input control circuit configured to output a counting input signal based on an input signal, an enabling signal, and a counting over signal;
   a counting circuit configured to generate a preliminary counting code based on a reset signal and the counting input signal;
   an output control circuit configured to generate a counting code based on the counting over signal and the preliminary counting code; and
   a counting operation control circuit configured to generate the counting over signal based on the reset signal and a part of the counting code.

2. The semiconductor device of claim 1, wherein the input control circuit outputs the input signal as the counting input signal or fixes the counting input signal to a specific level in response to the enabling signal and the counting over signal.

3. The semiconductor device of claim 2, wherein the input control circuit outputs the input signal as the counting input signal based on the enabling signal being enabled and the counting over signal being disabled, and the input control circuit fixes the counting input signal to the specific level based on the enabling signal being disabled or the counting over signal being enabled.

4. The semiconductor device of claim 1, wherein the counting circuit increases a code value of the preliminary counting code based on the reset signal being disabled and the counting input signal being transited to a specific level, and the counting circuit initializes the code value of the preliminary counting code regardless of the counting input signal.

5. The semiconductor device of claim 1, wherein the output control circuit outputs the preliminary counting code as the counting code or fixes a code value of the counting code to a maximum value in response to the counting over signal.

6. The semiconductor device of claim 5, wherein the output control circuit outputs the preliminary counting code as the counting code based on the counting over signal being disabled, and the output control circuit fixes the code value of the counting code to the maximum value based on the counting over signal being enabled.

7. The semiconductor device of claim 1, wherein the counting operation control circuit enables the counting over signal based on the part of the counting code increasing to a set value, and the counting operation control circuit disables the counting over signal based on the reset signal being enabled.

8. A semiconductor device comprising:
   a counting circuit configured to count an input signal to generate a counting code,
   wherein the semiconductor device determines a set code value in response to a control signal, and fixes the counting code to a maximum value based on the counting code increasing to the set code value.

9. The semiconductor device of claim 8,
   wherein the counting circuit increases a code value of a preliminary counting code when the counting input signal is transited to a specific level, and initializes the code value of the preliminary counting code based on a reset signal being enabled, and wherein the semiconductor device further comprises:

an input control circuit configured to output the input signal as a counting input signal in response to an enabling signal and a counting over signal;

an output control circuit configured to output the preliminary counting code as the counting code in response to the counting over signal;

an counting operation control circuit configured to generate the counting over signal in response to a part of the counting code and a set signal; and a maximum value set circuit configured to output another part of the counting code as the set signal in response to the control signal.

10. The semiconductor device of claim 9, wherein the input control circuit outputs the input signal as the counting input signal based on the enabling signal being enabled and the counting over signal being disabled, and the input control circuit fixes the counting input signal to the specific level regardless of the input signal except when the enabling signal is enabled and the counting over signal is disabled.

11. The semiconductor device of claim 9, wherein the output control circuit outputs the preliminary counting code as the counting code based on the counting over signal being disabled, and the output control circuit fixes the code value of the counting code to a maximum value based on the counting over signal being enabled.

12. The semiconductor device of claim 9, wherein the counting operation control circuit enables the counting over signal based on the part of the counting code and the set signal increasing to maximum values, and the counting operation control circuit disables the counting over signal based on the reset signal being enabled.

13. The semiconductor device of claim 9, wherein the maximum value set circuit fixes the set signal to a first level regardless of another part of the counting code based on the control signal being enabled, and the maximum value set circuit outputs another part of the counting code as the set signal based on the control signal being disabled.

14. A semiconductor device comprising:

an input control circuit configured to output a counting input signal based on an input signal and a counting over signal;

a counting circuit configured to generate a preliminary counting code based on the counting input signal;

an output control circuit configured to generate a counting code based on the preliminary counting code; and a counting operation control circuit configured to generate the counting over signal based on a part of the counting code, wherein the counting operation control circuit enables the counting over signal to fix the counting input signal to a specific level to prevent the counting circuit from increasing a code value of the preliminary counting code.

15. The semiconductor device of claim 14, wherein the counting over signal fixes the counting input signal to the specific level preventing the counting circuit from increasing the code value of the preliminary counting code to a maximum value of the preliminary counting code.

16. The semiconductor device of claim 14, wherein the counting over signal fixes the counting input signal to the specific level in response to a part of the counting code reaching a maximum value before the counting code increases to a maximum value.

* * * * *